United States Patent
Park et al.

(10) Patent No.: US 9,591,277 B2
(45) Date of Patent: Mar. 7, 2017

(54) COLOR SEPARATION ELEMENT ARRAY, IMAGE SENSOR INCLUDING THE COLOR SEPARATION ELEMENT ARRAY, AND IMAGE PICKUP APPARATUS INCLUDING THE COLOR SEPARATION ELEMENT ARRAY

(71) Applicant: SAMSUNG ELECTRONICS CO., LTD., Suwon-si (KR)

(72) Inventors: Hongkyu Park, Yongin-si (KR); Sunghyun Nam, Yongin-si (KR); Sookyoung Roh, Seoul (KR); Seokho Yun, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/738,396

(22) Filed: Jun. 12, 2015

(65) Prior Publication Data

US 2015/0365640 A1    Dec. 17, 2015

(30) Foreign Application Priority Data

Jun. 13, 2014    (KR) .................... 10-2014-0072294

(51) Int. Cl.
*H04N 9/30*         (2006.01)
*H04N 9/04*         (2006.01)
(Continued)

(52) U.S. Cl.
CPC ............... *H04N 9/30* (2013.01); *G02B 5/201* (2013.01); *G02B 5/203* (2013.01);
(Continued)

(58) Field of Classification Search
CPC .......... H04N 9/30; H04N 9/045; G03B 5/201; G02B 5/203; G02B 27/1013; G02B 27/4244; H01L 27/14621; H01L 27/14625
(Continued)

(56) References Cited

U.S. PATENT DOCUMENTS

| 8,076,745 B2 | 12/2011 | Nishiwaki |
| 8,294,076 B2 * | 10/2012 | Nishiwaki .............. H04N 9/045 250/208.1 |

(Continued)

FOREIGN PATENT DOCUMENTS

| KR | 10-2004-0079810 A | 9/2004 |
| KR | 10-2009-0016368 A | 2/2009 |

OTHER PUBLICATIONS

Communication dated Nov. 17, 2015, issued by the European Patent Office in counterpart European Application No. 15171730.3.

*Primary Examiner* — Nhan T Tran
(74) *Attorney, Agent, or Firm* — Sughrue Mion, PLLC

(57) ABSTRACT

A color separation element array includes a plurality of color separation elements arranged in two dimensions and separating an incident light according to a wavelength such that, of the incident light, a light of a first wavelength is directed to a first direction and a light of a second wavelength that is different from the first wavelength is directed to a second direction that is different from the first direction, in which each of the plurality of color separation elements includes a first element and a second element that are sequentially arranged according to a traveling direction of the incident light, and the first element and the second element of at least one of the plurality of color separation elements are shifted with respect to each other.

20 Claims, 10 Drawing Sheets

(51) Int. Cl.
   *H01L 27/146* (2006.01)
   *G02B 5/20* (2006.01)
   *G02B 27/10* (2006.01)
   *G02B 27/42* (2006.01)

(52) U.S. Cl.
   CPC ..... *G02B 27/1013* (2013.01); *G02B 27/4244* (2013.01); *H01L 27/14621* (2013.01); *H01L 27/14625* (2013.01); *H04N 9/045* (2013.01); *G02B 27/1086* (2013.01)

(58) Field of Classification Search
   USPC .......................................... 348/272, 273–276
   See application file for complete search history.

(56) References Cited

U.S. PATENT DOCUMENTS

| | | | |
|---|---|---|---|
| 8,400,537 | B2 | 3/2013 | McCarten et al. |
| 2009/0316274 | A1 | 12/2009 | Lee et al. |
| 2011/0085116 | A1 | 4/2011 | Kim |
| 2011/0164156 | A1* | 7/2011 | Hiramoto .......... H01L 27/14625 348/272 |
| 2013/0099343 | A1* | 4/2013 | Toshikiyo ......... H01L 27/14625 257/432 |
| 2013/0208273 | A1 | 8/2013 | Dominguez-Caballero et al. |

* cited by examiner

COLOR SEPARATION ELEMENT ARRAY, IMAGE SENSOR INCLUDING THE COLOR SEPARATION ELEMENT ARRAY, AND IMAGE PICKUP APPARATUS INCLUDING THE COLOR SEPARATION ELEMENT ARRAY

CROSS-REFERENCE TO RELATED APPLICATION

This application claims priority from Korean Patent Application No. 10-2014-0072294, filed on Jun. 13, 2014, in the Korean Intellectual Property Office, the disclosure of which is incorporated herein in its entirety by reference.

BACKGROUND

1. Field

The present disclosure relates to a color separation element array, an image sensor including the color separation element array, and an image pickup apparatus including the color separation element array, and more particularly, to a color separation element array that may improve a color separation efficiency at an edge portion thereof where light is obliquely incident, and to an image sensor and an image pickup apparatus using the color separation element array.

2. Description of the Related Art

Color display devices or color image sensors display an image of various colors or detect a color of incident light by using a color filter. An RGB color filter method, in which, for example, a green filter is arranged at two pixels of four pixels and a blue filter and a red filter are arranged in the other two pixels, is most widely employed by a currently used color display device or color image sensor. In addition to the RGB color filter method, a CYGM color filter method may be employed in which color filters of cyan, yellow, green, and magenta, which are complementary colors, are respectively arranged at four pixels.

However, a color filter may have a low light use efficiency because the color filter absorbs light of other colors except for filtered light. For example, when an RGB color filter is in use, only ⅓ of the incident light is transmitted and the other portion, that is, ⅔, of the incident light is absorbed. Accordingly, the light use efficiency may be about 33%. Accordingly, for the color display device or a color image sensor, most of a light loss is generated in the color filter.

Recently, to improve the light use efficiency of the color display device or color image sensor, a color separation element is being used instead of the color filter. The color separation element may separate colors of the incident light by using the diffraction or refraction characteristics of a light that varies according to a wavelength of the light. The colors separated by the color separation element may be transferred to pixels corresponding to the transferred colors. Accordingly, use of the color separation element may achieve a higher light use efficiency as compared to a case of using the color filter.

SUMMARY

One or more exemplary embodiments include a color separation element array, an image sensor including the color separation element array, and an image pickup apparatus including the color separation element array.

Additional aspects will be set forth in part in the description which follows and, in part, will be apparent from the description, or may be learned by practice of the presented exemplary embodiments.

According to an aspect of an exemplary embodiment, a color separation element array includes a plurality of color separation elements arranged in two dimensions and separating an incident light according to a wavelength such that, of the incident light, a light of a first wavelength is directed to a first direction and a light of a second wavelength that is different from the first wavelength is directed to a second direction that is different from the first direction, in which each of the plurality of color separation elements includes a first element and a second element that are sequentially arranged according to a traveling direction of the incident light, and the first element and the second element of at least one of the plurality of color separation elements are shifted with respect to each other.

The first and second elements of at least two of the color separation elements may be shifted with respect to each other differently.

The first element and the second element of one of the plurality of the color separation elements arranged in a center area of the color separation element array may be arranged such that center portions of the first element and the second element are aligned with each other, and the first element and the second element of each of the plurality of the color separation elements arranged in an area other than the center area of the color separation element array may be arranged to be shifted from each other.

The first element may be further shifted toward the center area of the color separation element array than the second element A shift distance between the first element and the second element may increase as a distance from the center area of the color separation element array increases.

The first element and the second element may be symmetrically shifted with respect to the center area of the color separation element array, and the first element and the second element of the plurality of the color separation elements may be shifted to be aligned to fit to a traveling direction of light that is obliquely incident.

The color separation element array may further include a transparent dielectric layer, in which the plurality of color separation elements are buried in the transparent dielectric layer, and a refractive index of the first element and a refractive index of the second element are greater than that of the transparent dielectric layer.

The refractive index of the first element and refractive index of the second element may be identical to each other.

The refractive index of the first element and refractive index of the second element may be different from each other.

Each of the plurality of color separation element may further include a third element that is arranged following the second element along the traveling direction of the incident light.

A width of the second element may be smaller than a width of the first element, and a width of the third element may be smaller than the width of the second element.

According to another aspect of an exemplary embodiment, an image sensor includes a pixel array including a plurality of pixels arranged in two dimensions and detecting light, and a color separation element array including a plurality of color separation elements arranged in two dimensions and separating an incident light according to a wavelength such that light of different wavelengths are incident on different pixels, in which each of the plurality of color separation elements includes a first element and a second element that are sequentially arranged according to a traveling direction of the incident light, and the first element and the second element of at least one of the plurality of color separation elements are shifted with respect to each other.

The first element and the second element of one of the plurality of the color separation elements arranged in a center area of the color separation element array may be arranged such that center portions of the first element and the second element are aligned with each other, and the first element and the second element of each of the plurality of the color separation elements arranged in an area other than the center area of the color separation element array may be arranged to be shifted from each other.

The first element may be further shifted toward the center area of the color separation element array than the second element A shift distance between the first element and the second element may increase as a distance from the center area of the color separation element array increases.

The first element and the second element may be symmetrically shifted with respect to the center area of the color separation element array, and the first element and the second element of the plurality of the color separation elements may be shifted to be aligned to fit to a traveling direction of light that is obliquely incident.

According to another aspect of an exemplary embodiment, an image pickup apparatus includes an objective lens, and an image sensor converting a light focused by the objective lens to an electric image signal, in which the image sensor includes a pixel array including a plurality of pixels arranged in two dimensions and detecting light, and a color separation element array including a plurality of color separation elements arranged in two dimensions and separating an incident light according to a wavelength such that light of different wavelengths are incident on different pixels, each of the plurality of color separation elements includes a first element and a second element that are sequentially arranged according to a traveling direction of the incident light, and the first element and the second element of at least one of the plurality of color separation elements are shifted with respect to each other.

The first element and the second element of one of the plurality of the color separation elements arranged in a center area of the color separation element array may be arranged such that center portions of the first element and the second element are aligned with each other, and the first element and the second element of each of the plurality of the color separation elements arranged in an area other than the center area of the color separation element array may be arranged to be shifted from each other.

The first element may be further shifted toward the center area of the color separation element array than the second element, a shift distance between the first element and the second element increases as a distance from the center area of the color separation element array may increase, and the first element and the second element may be symmetrically shifted with respect to the center area of the color separation element array.

The first element and the second element of the plurality of the color separation elements may be shifted to be aligned to fit to a traveling direction of a chief light that passes through the objective lens.

The image sensor may further include a transparent dielectric layer arranged on a surface of the pixel array, and the plurality of color separation elements may be buried in the transparent dielectric layer.

BRIEF DESCRIPTION OF THE DRAWINGS

The above and/or other aspects will become more apparent by describing certain exemplary embodiments with reference to the accompanying drawings, in which.

DETAILED DESCRIPTION

Figure 1:
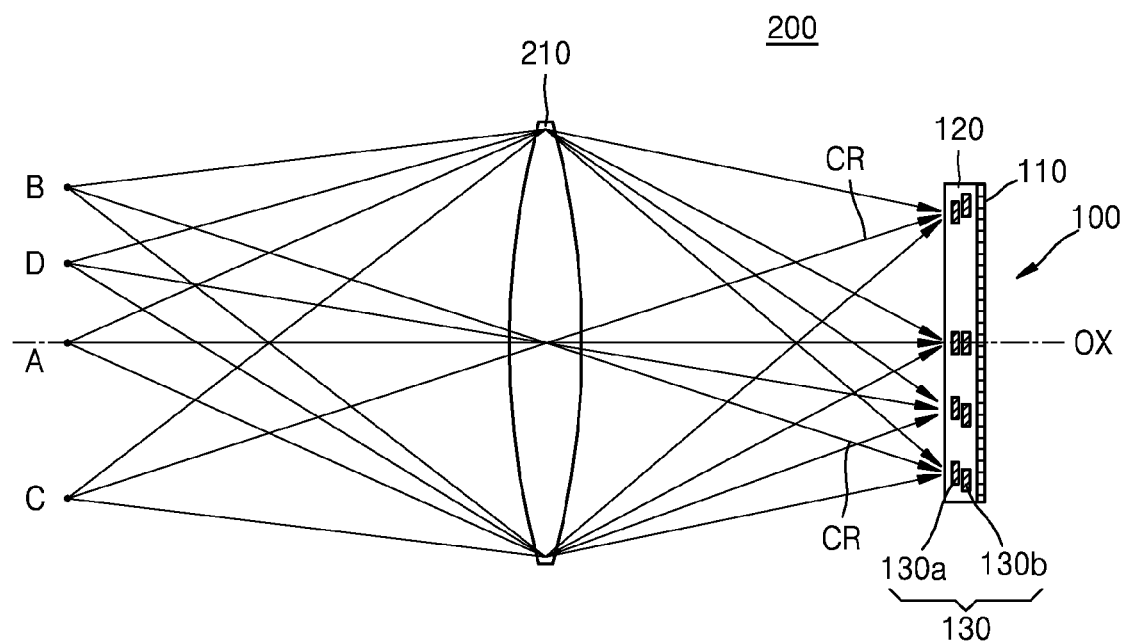
FIG. 1 is a cross-sectional view schematically illustrating an image pickup apparatus including a color separation element array and an image sensor according to an exemplary embodiment.

Certain exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail since they would obscure the description with unnecessary detail.

A color separation element array, an image sensor including the color separation element array, and an image pickup apparatus including the color separation element array are described in detail with reference to the accompanying drawings. In the following descriptions, like reference numerals refer to like elements. In the drawings, the size of each element is exaggerated for clarity and convenience of explanation. Also, in the following description of a layer structure, when a layer is described to exist "on" or "above" another layer, the layer may exist directly on or indirectly above the other layer, or a third layer may be interposed therebetween.

FIG. 1 is a cross-sectional view schematically illustrating an image pickup apparatus 200 and an image sensor 100 including a color separation element array according to an exemplary embodiment. Referring to FIG. 1, the image pickup apparatus 200 according to the present exemplary embodiment may include an objective lens 210 and the image sensor 100 for converting light focused by the objective lens 210 to an electric image signal. The image sensor 100 may include a pixel array 110 having a plurality of pixels detecting light and arranged in two dimensions (2D), and the color separation element array having a plurality of color separation elements 130 arranged in 2D. The image sensor 100 may further include a transparent dielectric layer 120 arranged on a surface of the pixel array 110. The color separation elements 130 may be buried in the transparent dielectric layer 120.

The color separation elements 130 are arranged at a light incident side of the pixel array 110 and each separate the incident light according to the wavelength of the incident light such that light of different wavelengths may be incident on different pixels. The color separation elements 130 may separate colors by changing traveling paths of light according to the wavelengths of the light by using the diffraction or refraction characteristics of the light that vary according to the wavelengths. For example, the color separation elements 130 are formed in various shapes such as a rod shape having a transparent symmetric or asymmetric structure or a prism shape having an inclined surface, which are well known, and a variety of designs may be available according to a desired spectrum distribution of an exit light. Light use efficiency may be increased by using the color separation elements 130 to optimize a spectrum distribution of light incident on the respective pixels to fit to the pixels. A positional relationship between the pixels of the image sensor 100 and the color separation elements 130 may be variously designed according to the color separation characteristics of the color separation elements 130.

Figure 2:
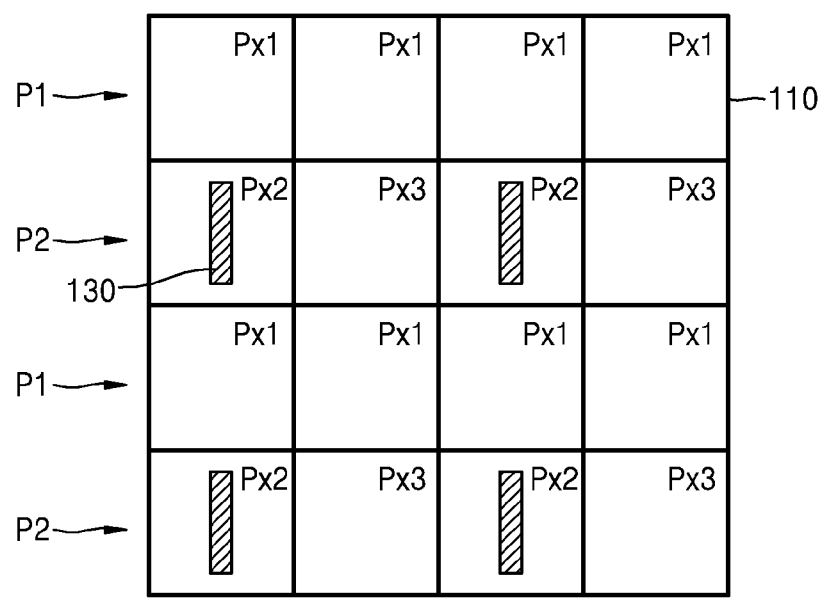
FIG. 2 is a plan view exemplarily illustrating a positional relationship between pixels of an image sensor and color separation elements.

For example, FIG. 2 is a plan view exemplarily illustrating a positional relationship between the pixels of the image sensor 100 and the color separation elements 130. Referring to FIG. 2, the image sensor 100 may include the pixel array 110 having a plurality of photodetector pixels Px1, Px2, and Px3 arranged in the form of a 2D matrix having a plurality of rows and columns. For example, as illustrated in FIG. 2, only the first pixels Px1 may be arranged in a first pixel row P1, and the second pixels Px2 and the third pixels Px3 may be alternately arranged in a second pixel row P2 that is adjacent to the first pixel row P1. The first pixel row P1 and the second pixel row P2 may be alternately arranged in a vertical direction. The color separation elements 130 may be arranged facing the second pixels Px2 in the second pixel row P2.

Figure 3:
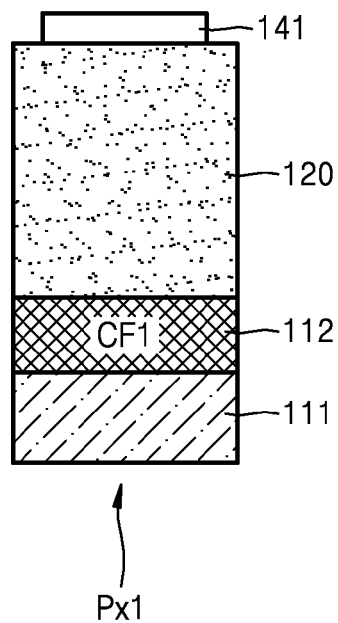
FIG. 3 is a cross-sectional view exemplarily illustrating a pixel structure of the image sensor of FIG. 2.

FIG. 3 is a cross-sectional view exemplarily illustrating a structure of the first pixel Px1 arranged in the first pixel row P1 of the image sensor 100 of FIG. 2. Referring to FIG. 3, the first pixel Px1 may include a light sensing layer 111, a color filter layer 112 arranged on a light incident surface of the light sensing layer 111, the transparent dielectric layer 120 arranged on the color filter layer 112, and a micro lens 141 arranged on the transparent dielectric layer 120 to focus the incident light on the light sensing layer 111. The light sensing layer 111 converts the incident light to an electric signal according to the intensity of the incident light. In such a structure, the incident light may be focused by the micro lens 141 on the light sensing layer 111 by passing through the transparent dielectric layer 120 and the color filter layer 112. The color filter layer 112 may include a first color filter CF1 that transmits only a light in a first wavelength band of the incident light. Accordingly, the first pixel Px1 may detect only the light in the first wavelength band.

Figure 4:
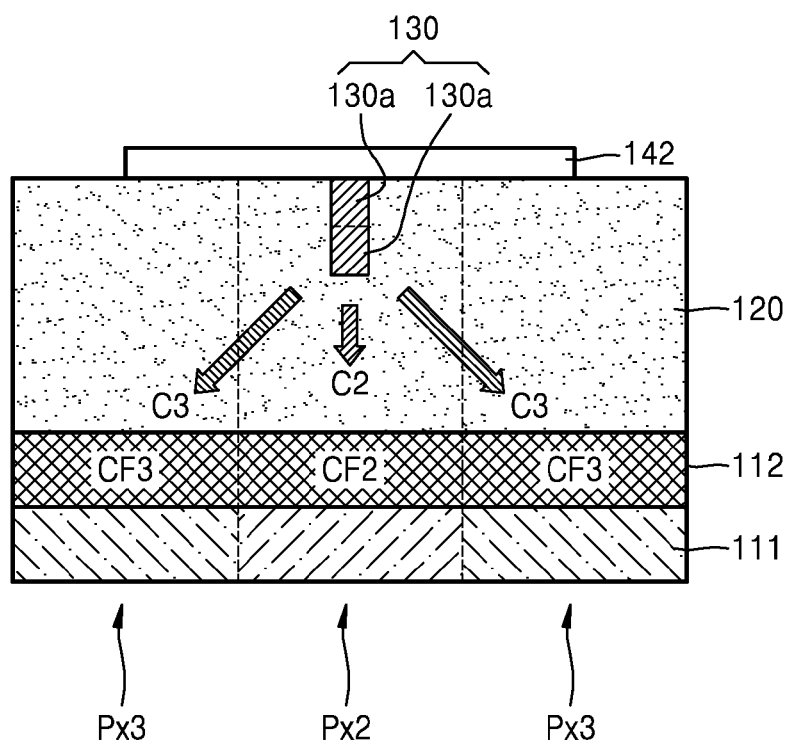
FIG. 4 is a cross-sectional view exemplarily illustrating another pixel structure of the image sensor of FIG. 2.

FIG. 4 is a cross-sectional view exemplarily illustrating a structure of the second and third pixels Px2 and Px3 arranged in the second pixel row P2 of the image sensor 100 of FIG. 2. Referring to FIG. 4, the second pixel row P2 may include the light sensing layer 111, a color filter layer 112 arranged on a light incident surface of the light sensing layer 111, the transparent dielectric layer 120 arranged on the color filter layer 112, the color separation elements 130 arranged in the transparent dielectric layer 120 of the second pixel Px2, and a micro lens 142 arranged on the transparent dielectric layer 120 to focus the incident light on the color separation elements 130. The color filter layer 112 may include a second color filter CF2 that is arranged in the second pixel Px2 to transmit only a light in a second wavelength band and a third color filter CF3 arranged in the third pixel Px3 to transmit only a light in a third wavelength band. The color separation elements 130 may be buried in the transparent dielectric layer 120 and may be fixed by being surrounded by the transparent dielectric layer 120.

In the above structure, while passing through the color separation elements 130, the light focused by the micro lens 142 may be separated into a light C2 of a second wavelength band and a light C3 of a third wavelength band by the color separation elements 130. The color separation elements 130 may be designed, for example, to change a traveling direction of the light C3 of the third wavelength band of the incident light into two inclined lateral directions without changing a traveling direction of the light C2 of the second wavelength band. Then, the light C2 of the second wavelength band may pass through the color separation elements 130 and may be incident on the light sensing layer 111 of the second pixel Px2 disposed directly under the color separation elements 130. On the other hand, after passing through the color separation elements 130, the light C3 of the third wavelength band may be incident on the light sensing layer 111 of each of the third pixels Px3 disposed at the opposite sides of the second pixel Px2.

In the example illustrated in FIGS. 2 to 4, in the first color filter CF1 of the first pixel Px1, only about 33% of the incident light is transmitted and arrives at the light sensing layer 111 as in a pixel structure of the related art. In contrast, in the second color filter CF2 of the second pixel Px2 and the third color filter CF3 of the third pixel Px3, since a ratio of a color corresponding to each of the color filters CF2 and CF3 is high, transmissivity of light increases compared to the pixel structure of the related art. Accordingly, light use efficiency in the second pixel Px2 and the third pixel Px3 may be increased. For example, the first wavelength band may be green, the second wavelength band may be blue, and the third wavelength band may be red. In other words, the first pixel Px1 may be a green pixel, the second pixel Px2 may be a blue pixel, and the third pixel Px3 may be a red pixel.

The structure of the pixel array 110 of the image sensor 100 and the characteristics of the color separation elements 130 illustrated in FIGS. 2 to 4 are a mere example to help understanding and are not limited to the exemplary embodiment illustrated in FIGS. 2 to 4. A variety of color separation characteristics may be selected according to the design of the color separation elements 130. A variety of structures of the pixel array 110 may be selected according to the color separation characteristics of the color separation elements 130. Also, a part or the entire of the micro lenses 141 and 142 and the color filters CF1, CF2, and CF3 may be omitted according to the design.

Referring back to FIG. 1, the objective lens 210 focuses an image of an object (not shown) on the image sensor 100. When the image sensor 100 is accurately located on a focal plane of the objective lens 210, a light starting from at a certain point of the object arrives at a certain point on the image sensor 100 by passing through the objective lens 210. For example, a light starting from a certain point A on an optical axis OX passes through the objective lens 210 and then arrives at a center of the image sensor 100 on the optical axis OX. Also, light starting from any one of points B, C, and D located out of the optical axis OX travels across the optical axis OX by the objective lens 210 and arrives at a point in a peripheral portion of the image sensor 100. For example, a light starting from the point B located above the optical axis OX arrives at a lower peripheral portion of image sensor 100, crossing the optical axis OX, and a light starting from the point C located under the optical axis OX arrives at an upper peripheral portion of the image sensor 100, crossing the optical axis OX. Also, a light starting from the point D located between the optical axis OX and the point B arrives at a position between the lower peripheral portion and the center of image sensor 100, crossing the optical axis OX.

Accordingly, the light starting from the different points A, B, C, and D are incident on the image sensor 100 at different incident angles according to the distance between the points A, B, C, and D and the optical axis OX. An incident angle of a light incident on the image sensor 100 is typically defined to be a chief ray angle (CRA). A chief ray (CR) denotes a light ray starting from a point of the object and arriving at the image sensor 100 by passing through a center of the objective lens 210. The CRA denotes an angle formed by the CR with respect to the optical axis OX. The CRA of the light starting from the point A on the optical axis OX is 0° and the light is perpendicularly incident on the image sensor 100. The CRA increases as the starting point is farther from the optical axis OX.

From the viewpoint of the image sensor 100, the CRA of the light incident on the center portion of the image sensor 100 is 0° and the CRA of the incident light gradually increases toward the edge of the image sensor 100. For example, the CRA of the light starting from each of the points B and C and arriving at the outermost edge of the image sensor 100 is the largest, whereas the CRA of the light starting from the point A and arriving at the center of the image sensor 100 is 0°. The CRA of the light starting from the point D and arriving at a position between the center and the edge of the image sensor 100 is greater than 0° and less than the CRA of the light starting from each of the points B and C.

However, the color separation elements 130 generally have a structure having directivity. Due to the directivity, the color separation elements 130 efficiently operate with respect to the light perpendicularly incident on the color separation elements 130. However, if the incident angle increases over a certain angle, the color separation efficiency of the color separation elements 130 is drastically lowered. Accordingly, when the color separation elements 130 having the same structure are arranged in the entire area of the image sensor 100, the quality of an image may be more degraded as a distance from the center portion of the image sensor 100 increases.

The color separation element array according to the present exemplary embodiment may include the color separation elements 130 that are configured to efficiently perform color separation even at the edge of the image sensor 100. For example, each of the color separation elements 130 may include a first element 130a and a second element 130b that are sequentially arranged in the direction of the optical axis OX or a traveling direction of the incident light. The first element 130a and the second element 130b of the color separation elements 130 may be shifted by different degrees according to the positions of the color separation elements 130 in the image sensor 100. For example, the first element 130a and the second element 130b of the color separation element 130 at the center portion of the image sensor 100 may be arranged such that the center portions, e.g., center lines, of the first element 130a and the second element 130b may be aligned with each other. The first element 130a and the second element 130b of the color separation element 130 arranged in an area other than the center portion of the image sensor 100 may be shifted with each other. For example, a shift distance between the first element 130a and the second element 130b as a distance from the center portion of the image sensor 100 increases. The first element 130a and the second element 130b of the color separation element 130 arranged at the outermost edge of the image sensor 100 may be shifted to the greatest extent with respect to each other.

Figure 5A:
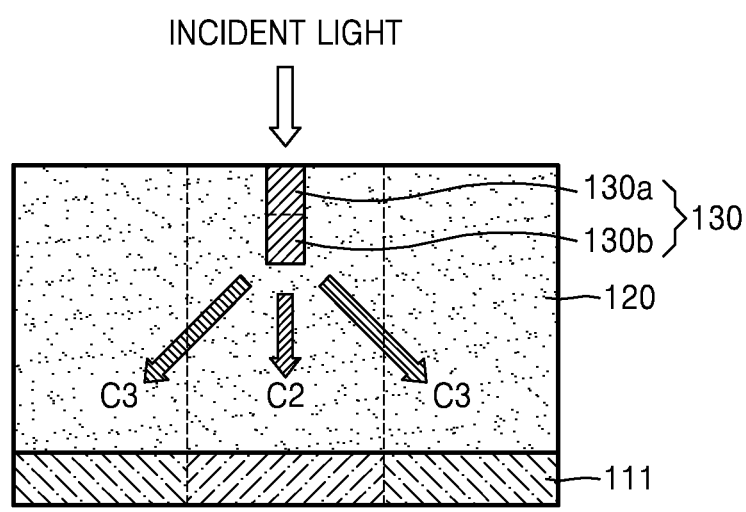
FIG. 5A is a cross-sectional view exemplarily illustrating a positional relationship between a first element and a second element of a color separation element when a light is perpendicularly incident on an image sensor.
Figure 5B:
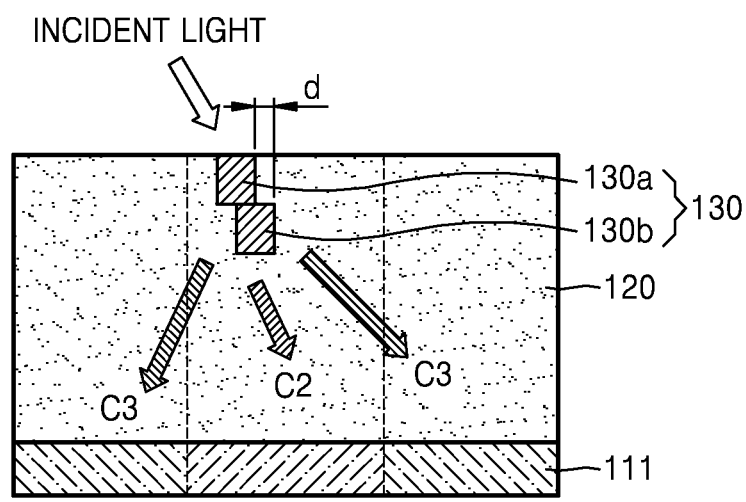
FIGS. 5B and 5C are cross-sectional views exemplarily illustrating in detail a positional relationship between the first element and the second element of the color separation element when a light is obliquely incident on the image sensor.
Figure 5C:
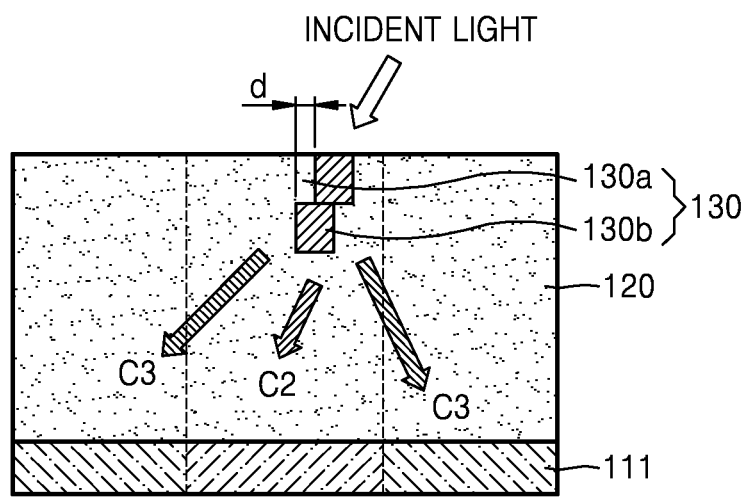

FIG. 5A is a cross-sectional view exemplarily illustrating a positional relationship between the first element 130a and the second element 130b of the color separation element 130 when a light is perpendicularly incident on the image sensor 100. FIGS. 5B and 5C are cross-sectional views exemplarily illustrating in detail a positional relationship between the first element 130a and the second element 130b of the color separation element 130 when a light is obliquely incident on the image sensor 100.

Referring to FIG. 5A, when the incident light is perpendicularly incident on the image sensor 100, the first element 130a and the second element 130b of the color separation element 130 are not shifted with each other. In this case, the first element 130a and the second element 130b of the color separation element 130 may be aligned along a center line (not shown) of a pixel facing the color separation element 130 such that the center portions of the first element 130a and the second element 130b may be matched with each other. In contrast, referring to FIGS. 5B and 5C, when the incident light is obliquely incident on the image sensor 100, the first element 130a and the second element 130b of the color separation element 130 may be shifted with each other. The first element 130a and the second element 130b of the color separation element 130 may be shifted to be aligned with the traveling direction of a light that is obliquely incident. For example, as illustrated in FIG. 5B, when the incident light is obliquely incident from the left side, the first element 130a may be relatively further shifted to the left compared to the second element 130b. Also, as illustrated in FIG. 5C, when the incident light is obliquely incident from the right side, the first element 130a may be relatively further shifted to the right compared to the second element 130b. A relative shift distance "d" of the first element 130a and the second element 130b gradually increases as the incident angle of the incident light increases, that is, the CRA increases.

Figure 6A:
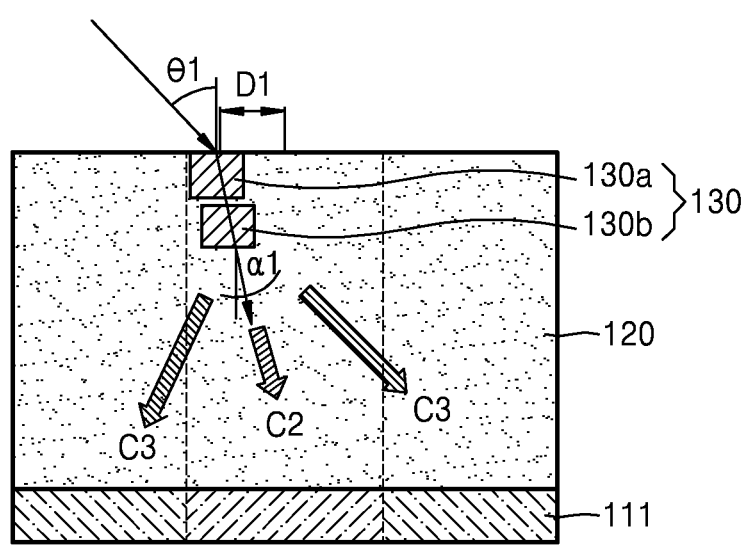
FIGS. 6A and 6B are cross-sectional views illustrating a change in the positions of the first element and the second element of the color separation element according to a change in a light incident angle.
Figure 6B:
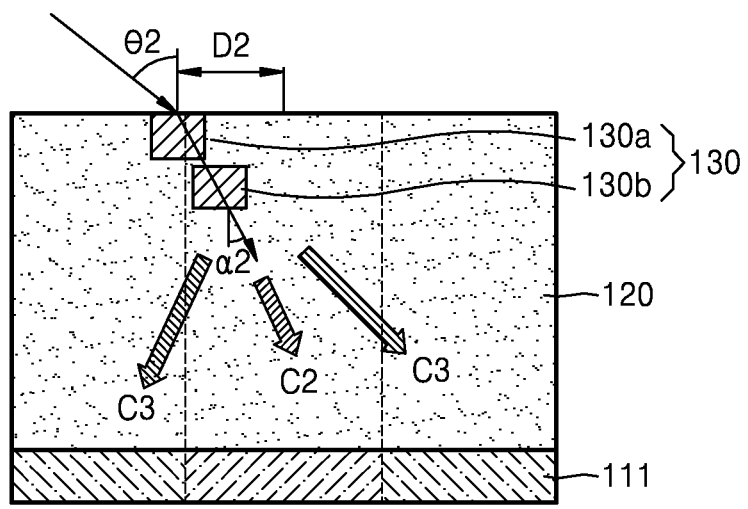

As described above, when the incident light is perpendicularly incident, the color separation elements 130 may be aligned along the center line of a pixel facing the color separation element 130. However, when the incident light is obliquely incident, the first and second elements 130a and 130b are relatively shifted with each other according to a direction in which a light is incident. FIGS. 6A and 6B are cross-sectional views illustrating a change in the positions of the first element 130a and the second element 130b of the color separation element 130 according to a change in a light incident angle.

For example, when the incident angle is θ1 as illustrated in FIG. 6A, the incident light may be refracted from a surface of the transparent dielectric layer 120 to travel inside the transparent dielectric layer 120 at an inclined angle of α1. Then, the second element 130b may be moved in the direction toward the incident light such that the light C2 of the second wavelength band exiting from the second element 130b accurately travels toward the center portion of the light sensing layer 111 of a pixel corresponding to the light C2 and the light C3 of the third wavelength band travel toward the center portion of the light sensing layer 111 of a pixel corresponding to the light C3. The first element 130a is further shifted with respect to the second element 130b in the direction toward the incident light such that the first element 130a and the second element 130b are arranged to match the inclined angle α1. As a result, the first element 130a may be moved by D1 from the center line of a pixel facing the color separation element 130.

The inclined angle α1 in which a light travels inside the transparent dielectric layer 120 may be calculated by the Snell's law. For example, an equation that $n1 \times \sin \theta 1 = n2 \times \sin \alpha 1$ is established, where "n1" is an external refractive index of the image sensor 100 and "n2" is an average refractive index of the transparent dielectric layer 120 and the color separation elements 130. The average refractive index n2 is calculated considering a volume ratio of the transparent dielectric layer 120 and the color separation elements 130. Since the incident angle θ1 may correspond to the CRA, the angle α at which the first and second elements 130a and 130b of the color separation elements 130 at a particular position of the image sensor 100 are aligned may satisfy an equation that $n1 \times \sin(CRAi) = n2 \times \sin \alpha$, where "CRAi" is the CRA at an i-th position.

On the other hand, when the incident angle is θ2 that is greater than θ1 as illustrated in FIG. 6B, the incident light is refracted on the surface of the transparent dielectric layer 120 and travels inside the transparent dielectric layer 120 at an inclined angle α2 that is greater than the inclined angle α1. Then, a degree that the first element 130a and the second element 130b are shifted in a direction toward the incident light may be increased compared to the case in FIG. 6A. As a result, the first element 130a may be shifted by D2 that is greater than D1 from the center line of a corresponding pixel such that the first element 130a and the second element 130b are arranged to match the inclined angle α2.

Figure 7A:
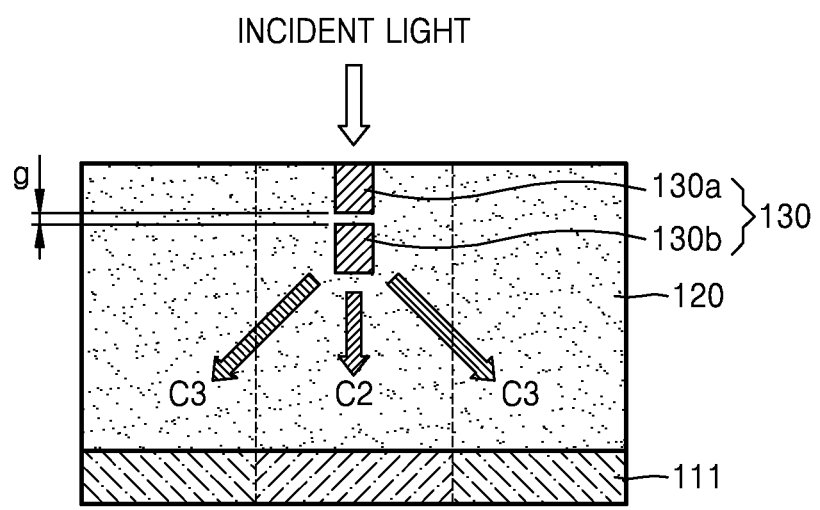
FIGS. 7A, 7B, 8A, 8B, 9A, and 9B are cross-sectional views exemplarily illustrating color separation elements according to various exemplary embodiments.
Figure 7B:
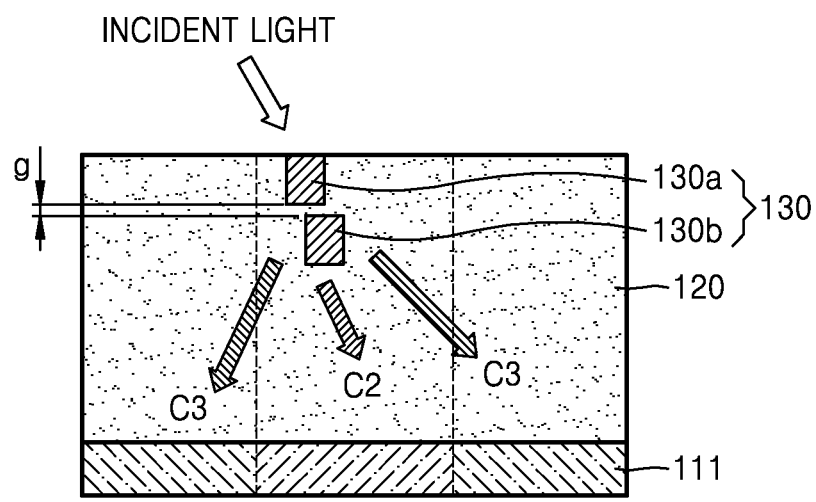

FIGS. 7A to 9B are cross-sectional views exemplarily illustrating the color separation elements 130 according to various exemplary embodiments. First, referring to FIGS. 7A and 7B, the first element 130a and the second element 130b of the color separation element 130 may be arranged to be separated from each other by a predetermined gap g. Although FIGS. 5A to 5C illustrate that the first element 130a and the second element 130b closely contact to each other, the structure thereof is not limited thereto. As illustrated in FIGS. 7A and 7B, the first element 130a and the second element 130b may be arranged to be separated from each other. The gap between the first element 130a and the second element 130b may be less than or equal to about 50 or 100 nm.

Figure 8A:
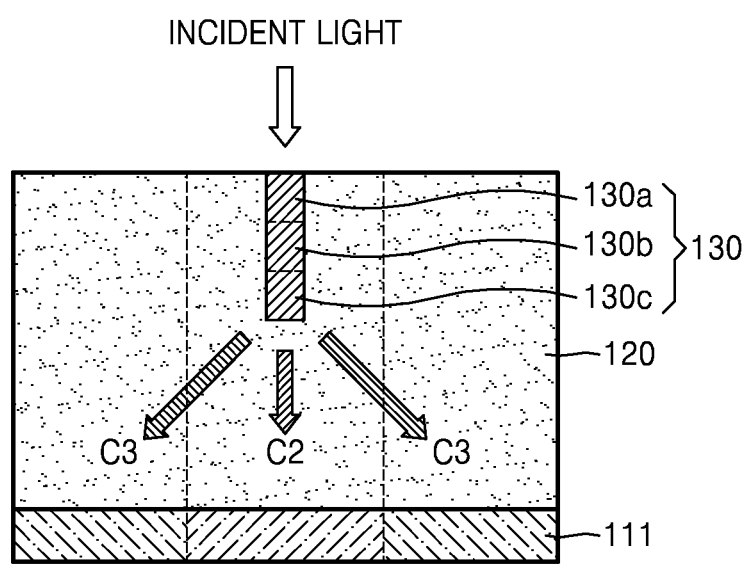
Figure 8B:
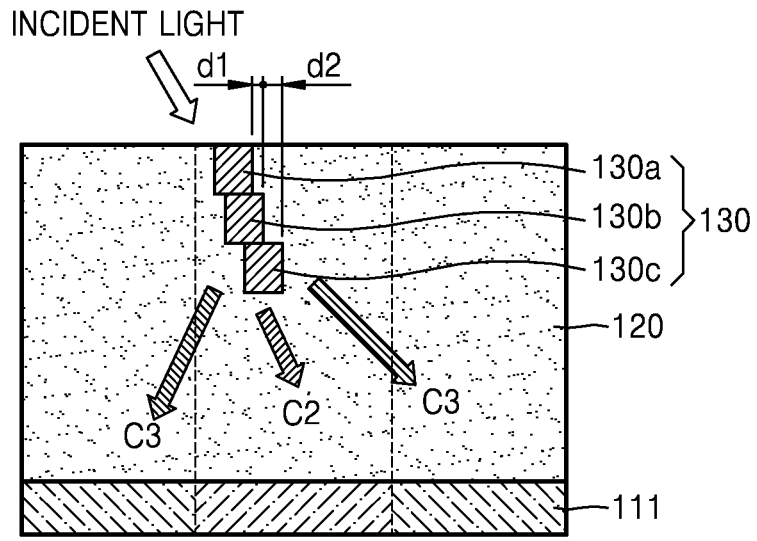

Also, referring to FIGS. 8A and 8B, the color separation element 130 may further include a third element 130c. The third element 130c may be arranged following the second element 130b in the traveling direction of the incident light. When the incident light is perpendicularly incident, the first to third elements 130a, 130b, and 130c of the color separation element 130 may be aligned along the center line of a corresponding pixel such that the center portions of the first to third elements 130a, 130b, and 130c are matched with one another as illustrated in FIG. 8A. In contract, when the incident light is obliquely incident, the first to third elements 130a, 130b, and 130c of the color separation element 130 may be shifted with respect to one another as illustrated in FIG. 8B. A relative shift distance d1 between the first element 130a and the second element 130b may be the same as or different from a relative shift distance d2 between the second element 130b and the third element 130c. The shift distance d1 and the shift distance d2 may be variously selected according to an incident angle of the incident light and a wavelength band to be separated. Although FIGS. 8A and 8B exemplarily illustrates that the color separation element 130 includes three elements, that is, the first to third elements 130a, 130b, and 130c, the color separation element 130 may include four or more elements that are sequentially arranged in a traveling direction of the incident light.

The widths of the first to third elements 130a, 130b, and 130c of the color separation element 130 may be the same as or different from one another. For example, the width of the first element 130a located at the foremost of the traveling direction of the incident light may be the largest and the width of the third element 130c located at the rearmost of the traveling direction of the incident light may be the smallest. The width of the second element 130b may be smaller than that of the first element 130a and larger than that of the third element 130c. As the widths of the first to third elements 130a, 130b, and 130c gradually decrease along the traveling direction of the incident light, the use of a material of the color separation elements 130 may be reduced while the color separation efficiency is maintained or improved.

On the other hand, the first to third elements 130a, 130b, and 130c of the color separation element 130 may be formed of a material having a higher refractive index than the refractive index of a surrounding portion. For example, the refractive indices of the first to third elements 130a, 130b, and 130c may be higher than the refractive index of the transparent dielectric layer 120. For example, the transparent dielectric layer 120 may be formed of $SiO_2$ or siloxane-based spin-on glass (SOG), the first to third elements 130a, 130b, and 130c may be formed of a material having a high refractive index, such as, $TiO_2$, $SiN_3$, ZnS, ZnSe, and $Si_3N_4$. Although the first to third elements 130a, 130b, and 130c may have the same refractive index, different refractive indices may be selected to improve the color separation efficiency according to the incident angle of the incident light and a wavelength band to be separated.

Figure 9A:
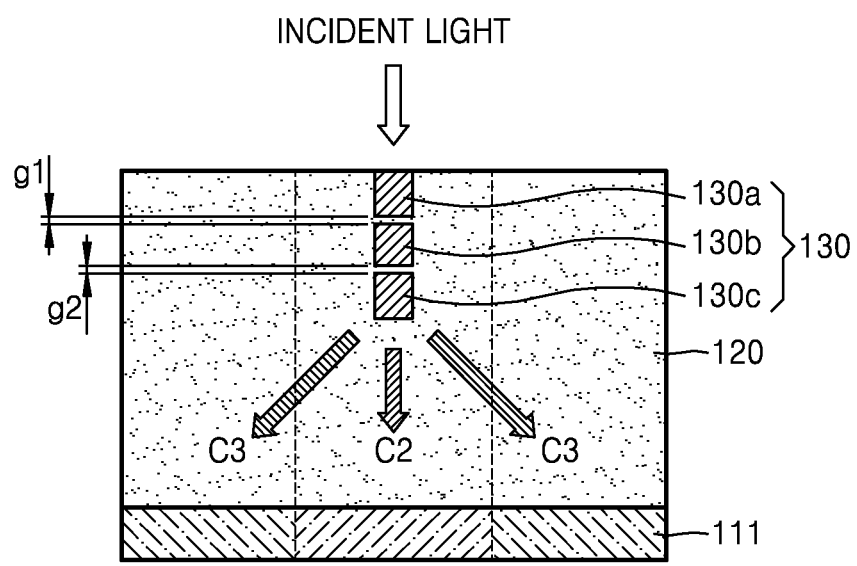
Figure 9B:
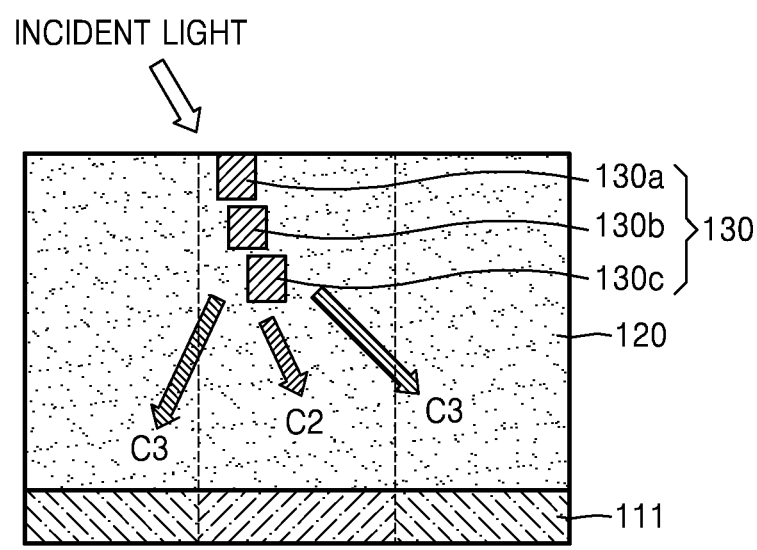

Although FIGS. 8A and 8B illustrate that the first to third elements 130a, 130b, and 130c closely contact one another, as illustrated in FIGS. 9A and 9B, the first to third elements 130a, 130b, and 130c may be arranged to be separated from one another. A gap g1 between the first element 130a and the second element 130b may be the same or different from a gap g2 between the second element 130b and the third element 130c. The gaps g1 and g2 may be selected based on the incident angle of the incident light and the shift distances d1 and d2 between the first to third elements 130a, 130b, and 130c, such that the first to third elements 130a, 130b, and 130c are arranged to match the travelling direction of the incident light. For example, both the gaps g1 and g2 may be selected to be less than or equal to about 50 or 100 nm.

Figure 10:
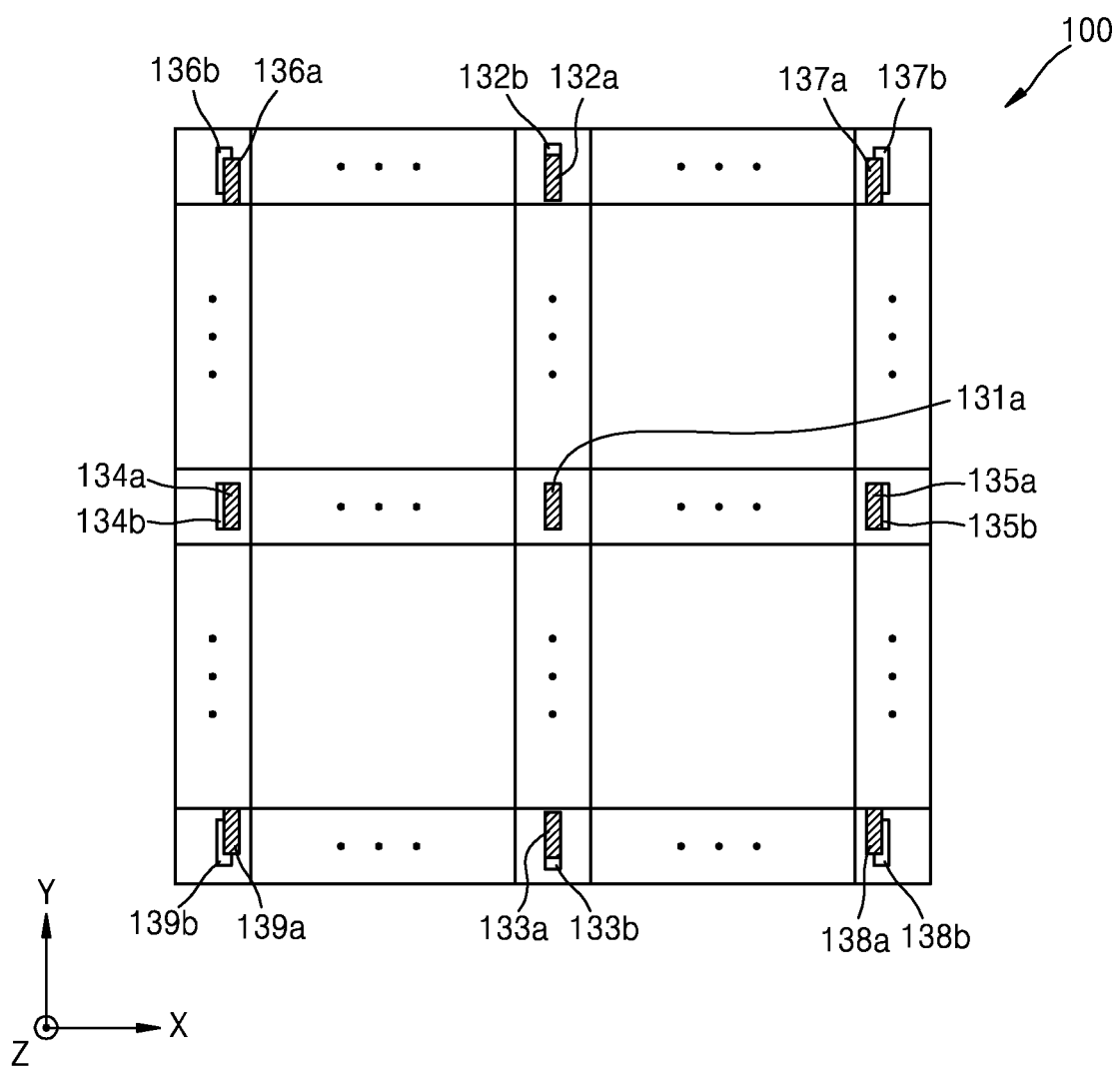
FIG. 10 is a plan view exemplarily illustrating shift forms of first elements and second elements according to the positions of a plurality of color separation elements in the image sensor.

FIG. 10 is a plan view exemplarily illustrating shift forms of first elements and second elements according to the positions of a plurality of color separation elements in the image sensor 100. Referring to FIG. 10, since a first element 131a and a second element of the color separation element are arranged to be overlapped with each other at the center portion of the image sensor 100, only the first element 131a is seen whereas the second element covered by the first element 131a is not seen. Also, first elements 132a, 133a, 134a, 135a, 136a, 137a, 138a, and 139a and second elements 132b, 133b, 134b, 135b, 136b, 137b, 138b, and 139b of the color separation elements located at a peripheral portion of the image sensor 100 are shifted with each other in a direction x and a direction y. Since a z-axis in FIG. 10 is the same direction as the optical axis OX, the first elements 132a, 133a, 134a, 135a, 136a, 137a, 138a, and 139a and the second elements 132b, 133b, 134b, 135b, 136b, 137b, 138b, and 139b may be shifted in a direction perpendicular to the optical axis OX.

For example, the first element 132a and the second element 132b located in the upper area of the image sensor 100 are shifted in a direction −y; the first element 133a and the second element 133b located in the lower area of the image sensor 100 are shifted in a direction +y; and the first element 134a and the second element 134b located at the left area of the image sensor 100 are shifted in a direction +x. The first element 138a and the second element 138b located in the lower right area of the image sensor 100 are shifted in the direction +y and a direction −x. As illustrated in FIG. 10, the first elements 132a, 133a, 134a, 135a, 136a, 137a, 138a, and 139a of the color separation elements arranged in a peripheral portion of the image sensor 100 are further shifted toward the center area compared to the second elements 132b, 133b, 134b, 135b, 136b, 137b, 138b, and 139b. The first elements 132a, 133a, 134a, 135a, 136a, 137a, 138a, and 139a and the second elements 132b, 133b, 134b, 135b, 136b, 137b, 138b, and 139b may be symmetrically shifted with respect to the center area of the image sensor 100. For example, the first elements 131a, 132a, 133a, 134a, 135a, 136a, 137a, 138a, and 139a and the second elements 132b, 133b, 134b, 135b, 136b, 137b, 138b, and 139b of the color separation elements may be shifted to be aligned with a traveling direction in the transparent dielectric layer 120 of the CR that passed through the objective lens 210.

Figure 11:
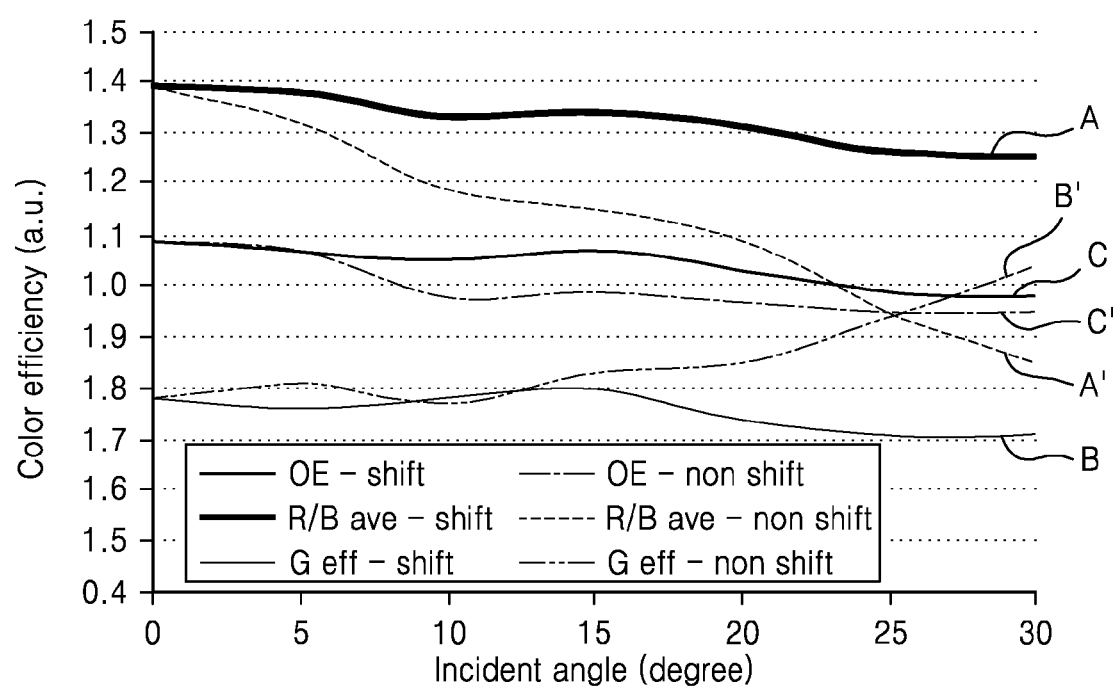
FIG. 11 is a graph exemplarily showing color separation efficiency according to a change in a light incident angle.

FIG. 11 is a graph exemplarily showing color separation efficiency according to a change in a light incident angle. In the graph of FIG. 11, curved lines indicated by A, B, and C denote color separation efficiencies when the first element and the second element are shifted according to the incident angle of the incident light, whereas curved lines indicated by A', B', and C' denote color separation efficiencies when the first element and the second element are not shifted regardless of the incident angle of the incident light. The curved lines A and A' denote color separation efficiencies of blue and red, the curved lines B and B' denote color separation efficiencies of green, and the curved lines C and C' denote average color separation efficiencies of the entire colors. As it may be seen from the graph of FIG. 11, the total average efficiencies C and C' for both cases of shifting and not shifting the first element and the second element are similar to each other. However, when the first element and the second element are not shifted, as the incident angle increases, the color separation efficiencies of blue and red decrease much and the color separation efficiency of green increases much. Accordingly, color distortion may greatly occur in the peripheral portion of the image sensor 100. In contrast, when the first element and the second element are shifted, a change in the color separation efficiency according to a change in the incident angle is not generated much. Accordingly, uniform color characteristics may be obtained through the entire area of the image sensor 100.

The foregoing exemplary embodiments and advantages are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A color separation element array comprising:
   color separation elements which are two-dimensionally arranged and configured to separate an incident light according to a wavelength such that, of the incident light, a light of a first wavelength is directed to a first direction and a light of a second wavelength that is different from the first wavelength is directed to a second direction that is different from the first direction,
   wherein each of the color separation elements comprises a first element and a second element that are sequentially arranged along a traveling direction of the incident light,
   the first element and the second element of one of the color separation elements, which is arranged in a center area of the color separation element array, are aligned with one another, such that center portions of the first element and the second element are aligned, and
   the first elements and the second elements of respective color separation elements, which are arranged in an area other than the center area of the color separation element array, are shifted with respect to one another, forming shifted pairs each comprising respective first and second elements.

2. The color separation element array of claim 1, wherein the first and second elements of at least two of the color separation elements are shifted with respect to each other differently.

3. The color separation element array of claim 1, wherein the first elements of the shifted pairs are shifted closer toward the center area of the color separation element array than the second elements of corresponding shifted pairs.

4. The color separation element array of claim 1, wherein the shifted pairs are disposed at locations spaced apart from the center area of the color separation element array, and
   a shift amount between the first and second elements of respective shifted pairs increases as a distance from the center area of the color separation element array to the respective shifted pairs increases.

5. The color separation element array of claim 1, wherein the first element and the second element of the shifted pairs are symmetrically shifted with respect to the center area of the color separation element array, to be aligned to fit to the traveling direction of the incident light that is obliquely incident.

6. The color separation element array of claim 1, further comprising a transparent dielectric layer,
   wherein the color separation elements are buried in the transparent dielectric layer, and
   a first refractive index of the first elements and a second refractive index of the second elements are greater than that of the transparent dielectric layer.

7. The color separation element array of claim 6, wherein the first refractive index and the second refractive index are identical to each other.

8. The color separation element array of claim 6, wherein the first refractive index and the second refractive index are different from each other.

9. The color separation element array of claim 1, wherein each of the color separation elements further comprises:
a third element that is arranged following the second element along the traveling direction of the incident light.

10. The color separation element array of claim 9, wherein a width of the second element is smaller than a width of the first element, and
a width of the third element is smaller than the width of the second element.

11. An image sensor comprising:
a pixel array comprising pixels which are two-dimensionally arranged and configured to detect light; and
a color separation element array comprising color separation elements which are two-dimensionally arranged and configured to separate an incident light according to a wavelength such that the light of different wavelengths is incident on different pixels,
wherein each of the color separation elements comprises a first element and a second element that are sequentially arranged along a traveling direction of the incident light,
the first element and the second element of one of the color separation elements, which is arranged in a center area of the color separation element array, are aligned with one another, such that center portions of the first element and the second element are aligned, and
the first elements and the second elements of respective color separation elements, which are arranged in an area other than the center area of the color separation element array, are shifted with respect to each other, forming shifted pairs each comprising respective first and second elements.

12. The color separation element array of claim 11, wherein the first and second elements of at least two of the color separation elements are shifted with respect to each other differently.

13. The image sensor of claim 11, wherein the first elements of the shifted pairs are shifted closer toward the center area of the color separation element array than the second elements of corresponding shifted pairs.

14. The image sensor of claim 11, wherein the shifted pairs are disposed at locations spaced apart from the center area of the color separation element array, and
a shift amount between the first and second elements of respective shifted pairs increases as a distance from the center area of the color separation element array to the respective shifted pairs increases.

15. The image sensor of claim 11, wherein the first element and the second element of the shifted pairs are symmetrically shifted with respect to the center area of the color separation element array, to be aligned to fit to the traveling direction of the incident light that is obliquely incident.

16. An image pickup apparatus comprising:
an objective lens; and
an image sensor, which is configured to convert a light focused by the objective lens to an electrical image signal, and comprises:
a pixel array comprising pixels which are two-dimensionally arranged and configured to detect the light; and
a color separation element array comprising color separation elements which are two-dimensionally arranged and configured to separate an incident light according to a wavelength such that the light of different wavelengths is incident on different pixels,
wherein each of the color separation elements comprises a first element and a second element that are sequentially arranged along a traveling direction of the incident light,
the first element and the second element of one of the color separation elements, which is arranged in a center area of the color separation element array, are aligned with one another, such that center portions of the first element and the second element are aligned, and
the first elements and the second elements of respective color separation elements, which are arranged in an area other than the center area of the color separation element array, are shifted with respect to one another, forming shifted pairs each comprising respective first and second elements.

17. The color separation element array of claim 16, wherein the first and second elements of at least two of the color separation elements are shifted with respect to each other differently.

18. The image pickup apparatus of claim 16, wherein the shifted pairs are disposed at locations spaced apart from the center area of the color separation element array,
the first elements of the shifted pairs are shifted closer toward the center area of the color separation element array than the second elements of corresponding shifted pairs,
a shift amount between the first and second elements of the corresponding shifted pairs increases as a distance from the center area of the color separation element array to the corresponding shifted pairs increases, and
the first element and the second element of the shifted pairs are symmetrically shifted with respect to the center area of the color separation element array.

19. The image pickup apparatus of claim 16, wherein the first element and the second element of the color separation elements are shifted to be aligned to fit to a traveling direction of a chief light that passes through the objective lens.

20. The image pickup apparatus of claim 16, wherein the image sensor further comprises a transparent dielectric layer arranged on a surface of the pixel array, and
the color separation elements are buried in the transparent dielectric layer.

* * * * *